United States Patent
Tang

(10) Patent No.: US 9,196,549 B2
(45) Date of Patent: Nov. 24, 2015

(54) METHOD FOR GENERATING DIE IDENTIFICATION BY MEASURING WHETHER CIRCUIT IS ESTABLISHED IN A PACKAGE STRUCTURE

(71) Applicant: UNITED MICROELECTRONICS CORP., Hsin-Chu (TW)

(72) Inventor: Kuang-Hui Tang, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/096,022

(22) Filed: Dec. 4, 2013

(65) Prior Publication Data

US 2015/0155209 A1 Jun. 4, 2015

(51) Int. Cl.
| | |
|---|---|
| *H01L 23/48* | (2006.01) |
| *H01L 21/768* | (2006.01) |
| *H01L 21/66* | (2006.01) |
| *H01L 23/00* | (2006.01) |

(52) U.S. Cl.
CPC ............... *H01L 22/10* (2013.01); *H01L 24/05* (2013.01); *H01L 24/14* (2013.01); *H01L 24/16* (2013.01); *H01L 24/13* (2013.01); *H01L 2223/5444* (2013.01); *H01L 2224/02381* (2013.01); *H01L 2224/0401* (2013.01); *H01L 2224/05568* (2013.01); *H01L 2224/05569* (2013.01); *H01L 2224/13027* (2013.01); *H01L 2224/1411* (2013.01); *H01L 2224/16106* (2013.01); *H01L 2224/16225* (2013.01); *H01L 2224/16227* (2013.01); *H01L 2224/16235* (2013.01); *H01L 2224/94* (2013.01); *H01L 2924/10253* (2013.01); *H01L 2924/15311* (2013.01)

(58) Field of Classification Search
CPC .............. H01L 24/14; H01L 23/39816; H01L 23/39838; H01L 24/17; H01L 222/0401; H01L 2224/13099; H01L 24/06; H01L 2224/17104; H01L 24/13; H01L 24/16; H01L 2224/06102; H01L 2224/1403; H01L 2224/14517; H01L 2924/00012; H01L 2924/00014
USPC .......... 257/738, 737, 734, 778, 668, 786, 787
See application file for complete search history.

(56) References Cited

U.S. PATENT DOCUMENTS

| | | | |
|---|---|---|---|
| 6,415,977 B1 * | 7/2002 | Rumsey ..................... 235/454 |
| 6,569,694 B1 * | 5/2003 | Sarma et al. ................. 438/14 |
| 6,718,604 B1 * | 4/2004 | Taga et al. .................. 29/25.35 |
| 7,586,183 B2 * | 9/2009 | Kawabata et al. ........... 257/686 |
| 7,868,283 B2 * | 1/2011 | Mabuchi .................. 250/208.1 |
| 7,989,959 B1 * | 8/2011 | Rahman ..................... 257/777 |
| 8,269,350 B1 * | 9/2012 | Chen et al. ................. 257/774 |
| 8,304,888 B2 * | 11/2012 | England et al. ............. 257/692 |
| RE44,130 E | 4/2013 | Lucero et al. |
| 8,796,863 B2 * | 8/2014 | Lee et al. ..................... 257/778 |

(Continued)

FOREIGN PATENT DOCUMENTS

KR      100866137 B1 * 10/2008

*Primary Examiner* — Alexander Oscar Williams

(74) *Attorney, Agent, or Firm* — Winston Hsu; Scott Margo

(57) ABSTRACT

A package structure is disclosed. The package structure includes a die; a substrate disposed corresponding to the die, wherein the substrate comprises a first dummy pad and a second dummy pad on a first surface of the substrate; and a first solder ball and a second solder ball on a second surface of the substrate and electrically connect the first dummy pad and the second dummy pad respectively.

4 Claims, 3 Drawing Sheets

(56) References Cited

U.S. PATENT DOCUMENTS

| | | | |
|---|---|---|---|
| 2005/0230824 A1* | 10/2005 | Watanabe et al. | 257/735 |
| 2009/0273097 A1* | 11/2009 | Hedler | 257/778 |
| 2010/0224977 A1* | 9/2010 | Kim | 257/686 |
| 2011/0095418 A1* | 4/2011 | Lim et al. | 257/737 |
| 2013/0069229 A1* | 3/2013 | Kang et al. | 257/737 |
| 2013/0127048 A1* | 5/2013 | Hasegawa et al. | 257/737 |
| 2013/0207259 A1 | 8/2013 | Yutani et al. | |
| 2013/0221493 A1* | 8/2013 | Kim et al. | 257/620 |
| 2013/0228898 A1* | 9/2013 | Ide | 257/621 |
| 2014/0124949 A1* | 5/2014 | Paek et al. | 257/774 |
| 2014/0193954 A1* | 7/2014 | Taoka et al. | 438/125 |

* cited by examiner

METHOD FOR GENERATING DIE IDENTIFICATION BY MEASURING WHETHER CIRCUIT IS ESTABLISHED IN A PACKAGE STRUCTURE

BACKGROUND OF THE INVENTION

1. Field of the Invention

The invention relates to a package structure and also a method of generating die identification (ID) by measuring weather a circuit is established in the package structure.

2. Description of the Prior Art

In company with the development of fabrication technology, the current integrated circuits have higher complexity and smaller size compared to the conventional integrated circuits. Therefore, a flip-chip package technology with relatively high integration density and relatively more input/output pins has been developed. The flip-chip package is a technology that can connect semiconductor elements, such as a die being processed and diced from a semiconductor wafer to external circuits. The aforementioned external circuits may include package carriers or printed circuit boards.

Compared to the other packaging technologies, the merits of the flip-chip package technology include more area for input/output connections, reaching relatively high transmission rates with relatively little interference, and preventing interference from the external environmental factors.

Typically, die identification (ID) providing information to the specific location of each die relative to the wafer is required during a yield improvement analysis. However, conventional fabrication process after package structures being fabricated provides no means whatsoever for generating die ID for each die. Instead, die IDs providing information to each die's specific location relative to the wafer needs to be written manually by the packaging facilities, which not only delays cycle time but also results in frequent errors.

SUMMARY OF THE INVENTION

It is therefore an objective of the present invention to provide a novel package structure and a novel method for generating die identification based on the feature of the package structure for resolving the aforementioned issues.

According to a preferred embodiment of the present invention, a package structure is disclosed. The package structure includes: a die; a substrate disposed corresponding to the die, wherein the substrate comprises a first dummy pad and a second dummy pad on a first surface of the substrate; and a first solder ball and a second solder ball on a second surface of the substrate and electrically connect the first dummy pad and the second dummy pad respectively.

According to another aspect of the present invention, a package structure is disclosed. The package structure includes: a die, comprising a bump pad thereon, wherein the bump pad is electrically connected to an electrical potential; a substrate, comprising a dummy pad on a first surface of the substrate; and a solder ball on a second surface of the substrate and electrically connect to the dummy pad.

According to another aspect of the present invention, a method for generating die identification (ID) is disclosed. The method includes the steps of: providing a die having at least one pad thereon; mounting the die onto a substrate, wherein the substrate comprises at least one solder ball; and measuring whether a circuit is established through the at least one solder ball for determining a die ID.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
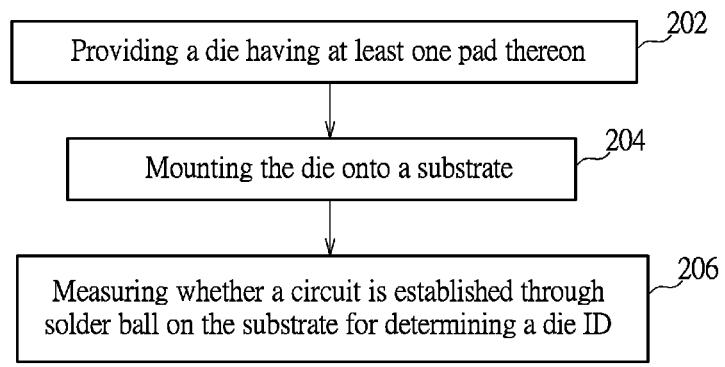
FIG. 1 is a flow chart diagram illustrating procedures for generating die ID according to a preferred embodiment of the present invention.
Figure 2:
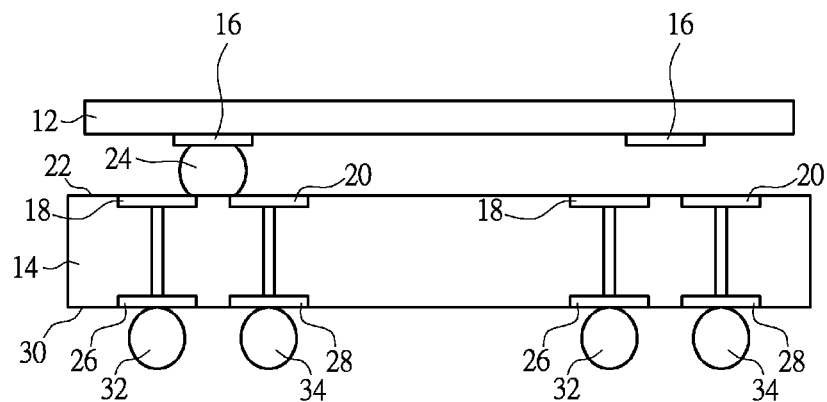
FIG. 2 is a perspective view illustrating a package structure according to a first embodiment of the present invention.

Referring to FIGS. 1-2, FIG. 1 is a flow chart diagram illustrating procedures for generating die ID according to a preferred embodiment of the present invention and FIG. 2 is a perspective view illustrating a package structure according to a first embodiment of the present invention. First, at step 202 of FIG. 1, a die 12 and a substrate 14 disposed corresponding to the die 12 is provided. The die 12 may be a fragment obtained from a silicon wafer that has been diced and processed to include all of the interconnections necessary, and the substrate 14 may be a printed circuit board or any other packaging substrate.

Next, at step 204, the die 12 is mounted onto the substrate 14.

Preferably in the first embodiment, the package structure after the die 12 being mounted on the substrate 14 could have two configurations, such as a first configuration shown on the left that includes a single bump pad 16 on the die 12, a first dummy pad 18 and a second dummy pad 20 on a first surface 22 of the substrate 14, and a dummy bump 24 between and contact the bump pad 16, the first dummy pad 18, and the second dummy pad 20, and a second configuration on the right that includes no dummy bmp formed between the bump pad and the two dummy pads 18 and 20.

The package structure also includes a first solder pad 26 and a second solder pad 28 on a second surface 30 of the substrate 14, and a first solder ball 32 and a second solder ball 34 mounted on the first solder pad 26 and the second solder pad 28. In other words, the first solder pad 26 and the second solder pad 28 are preferably between the first solder ball 32, the second solder ball 34, and the substrate 14, and the first solder ball 32 and the second solder ball 34 are electrically connected to the first dummy pad 18 and the second dummy pad 20 respectively.

After the die 12 is mounted on the substrate 14, as revealed in the step 206, a die ID is determined preferably by measuring whether a circuit is established through the first solder ball 32 and the second solder ball 34. According to a preferred embodiment of the present invention, the die IDs are collected according to a binary data system.

For instance, if no dummy bump is disposed between the one single bump pad 16 and the first dummy pad 18 and the second dummy pad 20, such as shown on the right side of the package structure, a die ID of zero could be determined, whereas if a dummy bump is present as between the one single bump pad 16 and the first dummy pad 18 and the second dummy pad 20, such as shown on the left side of the package structure, a die ID of one could be determined. By acquiring the die ID in this manner, such as by using the binary outputs obtained, the location of each die relative to the entire wafer could be determined accordingly. It should also be noted that even though only two set of configurations are shown in FIG. 2 of this embodiment, the quantity of the set of configurations is not limited to two, but could be adjusted and expanded according to the demand of product or number of die IDs required, which is also within the scope of the present invention.

Figure 3:
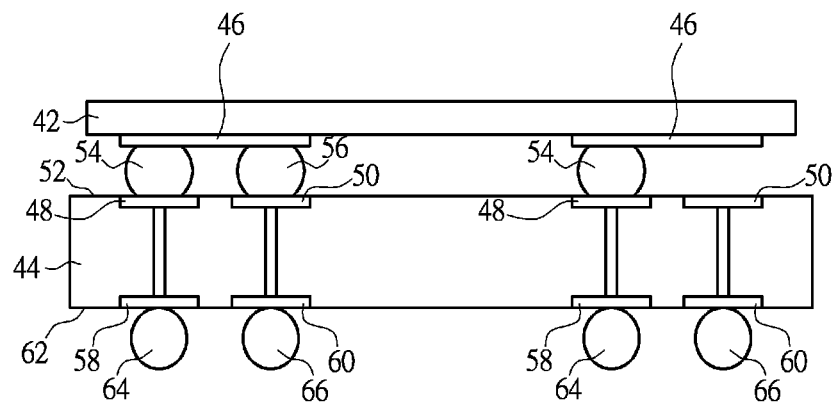
FIG. 3 is a perspective view illustrating a package structure according to a second embodiment of the present invention.

Referring to FIGS. 1-3, in which FIG. 3 is a perspective view illustrating a package structure according to a second embodiment of the present invention. Similar to the first embodiment, as shown in steps 202 and 204 of FIG. 1, a package structure is fabricated by first providing a die 42 and a substrate 44 and then mounting the die 42 on the substrate 44.

In the second embodiment, the package structure could have two configurations, such as a first configuration shown on the left that includes a under bump metallurgy (UBM) layer 46 on the die 42, a first dummy pad 48 and a second dummy pad 50 on a first surface 52 of the substrate 44, a first dummy bump 54 between and contact the UBM layer 46 and the first dummy pad 48, and a second dummy bump 56 between and contact the UBM layer 46 and the second dummy pad 50, and a second configuration on the right that includes only one dummy bump 54 formed between the UBM layer 46 and the first dummy pad 48.

The package structure also includes a first solder pad 58 and a second solder pad 60 on a second surface 62 of the substrate 44, and a first solder ball 64 and a second solder ball 66 mounted on the first solder pad 58 and the second solder pad 60. In other words, the first solder pad 58 and the second solder pad 60 are preferably between the first solder ball 64, the second solder ball 66, and the substrate 44, and the first solder ball 64 and the second solder ball 66 are electrically connected to the first dummy pad 48 and the second dummy pad 50 respectively.

After the die 42 is mounted on the substrate 44, as revealed in the step 206, a die ID is determined preferably by measuring whether a circuit is established through the first solder ball 64 and the second solder ball 66. According to a preferred embodiment of the present invention, the die IDs are collected according to a binary data system.

For instance, if a dummy bump 54 is disposed between the UBM layer 46 and the first dummy pad 48 and no dummy bump is disposed between the UBM layer 46 and the second dummy pad 50, such as shown on the right side of the package structure, a die ID of one could be determined, whereas if a first dummy bump 54 is disposed between the UBM layer 46 and the first dummy pad 48 and a second dummy bump 56 is disposed between the UBM layer 46 and the second dummy pad 50, such as shown on the left side of the package structure, a die ID of zero could be determined.

In other words, if only one dummy bump is present between the UBM layer 46 and either one of the first dummy pad 48 and the second dummy pad 50, a die ID of one is obtained, whereas if two dummy bumps are present at the same time between the UBM layer 46 and the two dummy pads 48 and 50, a die ID of zero could be obtained. By acquiring the die ID in this manner, such as by using the binary outputs obtained, the location of each die relative to the entire wafer could be determined accordingly. It should also be noted that even though only two set of configurations are shown in FIG. 3 of this embodiment, the quantity of the set of configurations is not limited to two, but could be adjusted and expanded according to the demand of product or number of die IDs required, which is also within the scope of the present invention.

Figure 4:
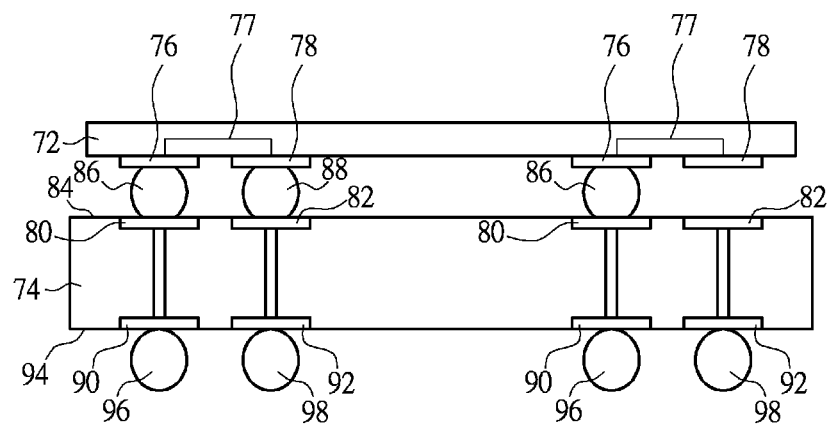
FIG. 4 is a perspective view illustrating a package structure according to a third embodiment of the present invention.

Referring to FIGS. 1-4, in which FIG. 4 is a perspective view illustrating a package structure according to a third embodiment of the present invention. Similar to the aforementioned embodiments, as shown in steps 202 and 204 of FIG. 1, a die 72 and a substrate 74 are provided and the die 72 is mounted on the substrate 74.

In the third embodiment, the package structure could have two configurations, such as a first configuration shown on the left that includes a first bump pad 76 and a second bump pad 78 on the die 72, a first dummy pad 80 and a second dummy pad 82 on a first surface 84 of the substrate 74, a first dummy bump 86 between and contact the first bump pad 76 and the first dummy pad 80, and a second dummy bump 88 between and contact the second bump pad 78 and the second dummy pad 82, and a second configuration on the right that includes only one dummy bump 86 formed between the first bump pad 76 and the first dummy pad 80. Preferably in this embodiment, the first bump pad 76 and the second bump pad 78 are electrically connected internally through an electrical connection 77 in the die 72.

The package structure also includes a first solder pad 90 and a second solder pad 92 on a second surface 94 of the substrate 74, and a first solder ball 96 and a second solder ball 98 mounted on the first solder 90 pad and the second solder pad 92. In other words, the first solder pad 90 and the second solder pad 92 are preferably between the first solder ball 96, the second solder ball 98, and the substrate 74, and the first solder ball 96 and the second solder ball 98 are electrically connected to the first dummy pad 80 and the second dummy pad 82 respectively.

After the die 72 is mounted on the substrate 74, as revealed in the step 206, a die ID is determined preferably by measuring whether a circuit is established through the first solder ball 96 and the second solder ball 98. According to a preferred embodiment of the present invention, the die IDs are collected according to a binary data system.

For instance, if a dummy bump 86 is disposed between the first bump pad 76 and the first dummy pad 80 and no dummy bump is disposed between the second bump pad 78 and the second dummy pad 82, such as shown on the right side of the package structure, a die ID of one could be determined, whereas if a first dummy bump 86 is disposed between the first bump pad 76 and the first dummy pad 80 and a second dummy bump 88 is disposed between the second bump pad 78 and the second dummy pad 82, such as shown on the left side of the package structure, a die ID of zero could be determined.

In other words, if only one dummy bump is present between the two bump pads 76 and 78 and the two dummy pads 80 and 82, a die ID of one is obtained, whereas if two dummy bumps are present at the same time between the two bump pads 76 and 78 and the two dummy pads 80 and 82, a die ID of zero could be obtained. By acquiring the die ID in this manner, such as by using the binary outputs obtained, the location of each die relative to the entire wafer could be determined accordingly. It should also be noted that even though only two set of configurations are shown in FIG. 4 of this embodiment, the quantity of the set of configurations is not limited to two, but could be adjusted and expanded according to the demand of product or number of die IDs required, which is also within the scope of the present invention.

Figure 5:
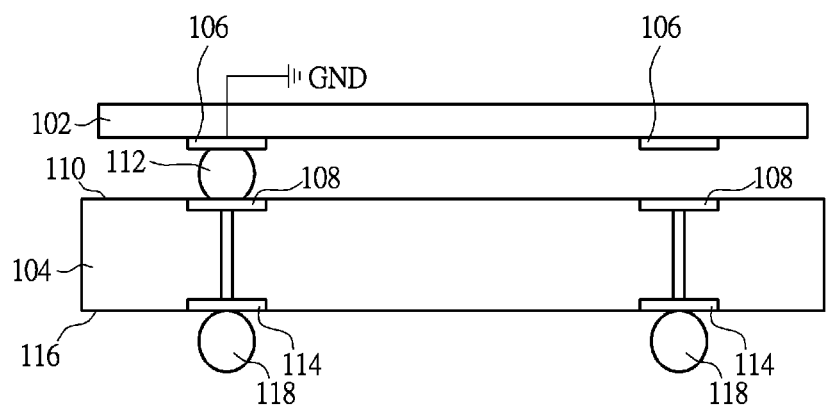
FIG. 5 is a perspective view illustrating a package structure according to a fourth embodiment of the present invention.

Referring to FIGS. 1-5, in which FIG. 5 is a perspective view illustrating a package structure according to a fourth embodiment of the present invention. Similar to the aforementioned embodiments, as shown in steps 202 and 204 of FIG. 1, a package structure is fabricated by first providing a die 102 and a substrate 104 and then mounting the die 102 on the substrate 104.

In the fourth embodiment, the package structure could have two configurations, such as a first configuration shown on the left that includes a single bump pad 106 on the die 102, a single dummy pad 108 on a first surface 110 of the substrate 104, and a single dummy bump 112 between and contact the bump pad 106 and the dummy pad 108, and a second configuration on the right that includes no dummy bump formed between the bump pad 106 and the dummy pad 108. Preferably in this embodiment, the bump pad 106 is electrically connected to an electrical potential, such as a ground GND.

The package structure also includes a solder pad 114 on a second surface 116 of the substrate 104 and a solder ball 118 mounted on the solder pad 114. In other words, the solder pad 114 is preferably between the solder ball 118 and the substrate 104, and the solder ball 118 is electrically connected to the dummy pad 108.

After the die 102 is mounted on the substrate 104, as revealed in the step 206, a die ID is determined preferably by measuring whether a circuit is established through the solder ball 118. According to a preferred embodiment of the present invention, the die IDs are collected according to a binary data system.

For instance, if no dummy bump is disposed between the one single bump pad 106 and the one single dummy pad 108, such as shown on the right side of the package structure, a die ID of zero could be determined, whereas if a dummy bump 112 is disposed between the one single bump pad 106 and the one single dummy pad 108, such as shown on the left side of the package structure, a die ID of one could be determined. By acquiring the die ID in this manner, such as by using the binary outputs obtained, the location of each die relative to the wafer could be determined accordingly. It should also be noted that even though only two set of configurations are shown in FIG. 5 of this embodiment, the quantity of the set of configurations is not limited to two, but could be adjusted and expanded according to the demand of product or number of die IDs required, which is also within the scope of the present invention.

Figure 6:
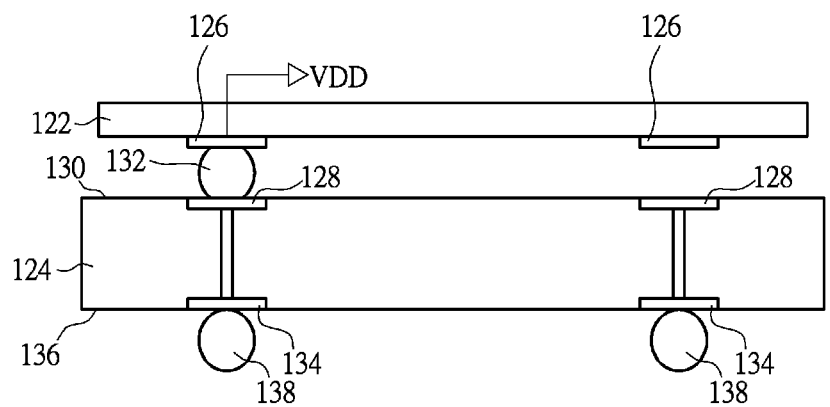
FIG. 6 is a perspective view illustrating a package structure according to a fifth embodiment of the present invention.

Referring to FIGS. 1-6, in which FIG. 6 is a perspective view illustrating a package structure according to a fifth embodiment of the present invention. Similar to the aforementioned embodiments, as shown in steps 202 and 204 of FIG. 1, a package structure is fabricated by first providing a die 122 and a substrate 124 and then mounting the die 122 on the substrate 124.

In the fifth embodiment, the package structure could have two configurations, such as a first configuration shown on the left that includes a single bump pad 126 on the die 122, a single dummy pad 128 on a first surface 130 of the substrate 124, and a single dummy bump 132 between and contact the bump pad 126 and the dummy pad 128, and a second configuration on the right that includes no dummy bump formed between the bump pad 126 and the dummy pad 128. Preferably in this embodiment, the bump pad 126 is electrically connected to an electrical potential, such as a voltage source VDD.

The package structure also includes a solder pad 134 on a second surface 136 of the substrate 124 and a solder ball 138 mounted on the solder pad 134. In other words, the solder pad 134 is preferably between the solder ball 138 and the substrate 124, and the solder ball 138 is electrically connected to the dummy pad 128.

After the die 122 is mounted on the substrate 124, as revealed in the step 206, a die ID is determined preferably by measuring whether a circuit is established through the solder ball 138. According to a preferred embodiment of the present invention, the die IDs are collected according to a binary data system.

For instance, if no dummy bump is disposed between the one single bump pad 126 and the one single dummy pad 128, such as shown on the right side of the package structure, a die ID of zero could be determined, whereas if a dummy bump 132 is disposed between the one single bump pad 126 and the one single dummy pad 128, such as shown on the left side of the package structure, a die ID of one could be determined. By acquiring the die ID in this manner, such as by using the binary outputs obtained, the location of each die relative to the wafer could be determined accordingly. It should also be noted that even though only two set of configurations are shown in FIG. 6 of this embodiment, the quantity of the set of configurations is not limited to two, but could be adjusted and expanded according to the demand of product or number of die IDs required, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package structure, comprising:
   a die;
   a substrate disposed corresponding to the die, wherein the substrate comprises a first dummy pad and a second dummy pad on a first surface of the substrate;
   a bump pad on the die, wherein the bump pad overlaps the first dummy pad and the second dummy pad; and
   a first solder ball and a second solder ball on a second surface of the substrate and electrically connect the first dummy pad and the second dummy pad respectively.

2. The package structure of claim 1, further comprising a dummy bump between and contact the bump pad, the first dummy pad, and the second dummy pad.

3. The package structure of claim 1, further comprising a first solder pad and a second solder pad between the first solder ball, the second solder ball, and the substrate.

4. A method for generating die identification (ID), comprising:
   providing a die having at least one pad thereon, wherein the at least pad comprises one single bump pad;
   mounting the die onto a substrate, wherein the substrate comprises at least one solder ball, the substrate comprises a first dummy pad and a second dummy pad on a first surface of the substrate, and the at least one solder ball comprises a first solder ball and a second solder ball on a second surface of the substrate; and measuring whether a circuit is established through the at least one solder ball by determining a die ID as zero if no dummy bump is disposed between the one single bump pad and the first dummy pad and the second dummy pad, or determining the die ID as one if a dummy bump is disposed between the one single bump pad and the first dummy pad and the second dummy pad.

* * * * *